(12) United States Patent
Joshi et al.

(10) Patent No.: US 11,409,940 B2
(45) Date of Patent: Aug. 9, 2022

(54) VIRTUAL TO REAL WAVEFORM EMULATOR

(71) Applicant: INTERNATIONAL BUSINESS MACHINES CORPORATION, Armonk, NY (US)

(72) Inventors: Rajiv Joshi, Yorktown Heights, NY (US); Sudipto Chakraborty, Plano, TX (US); Joseph Allen Glick, Putnam Valley, NY (US); Pat Rosno, Rochester, MN (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 17/124,484

(22) Filed: Dec. 16, 2020

(65) Prior Publication Data
US 2022/0188500 A1    Jun. 16, 2022

(51) Int. Cl.
*G06F 30/398*    (2020.01)
*G06N 10/00*    (2022.01)
*B82Y 10/00*    (2011.01)

(52) U.S. Cl.
CPC ............ *G06F 30/398* (2020.01); *B82Y 10/00* (2013.01); *G06N 10/00* (2019.01)

(58) Field of Classification Search
CPC .................................................... G06F 30/398
USPC ......................................................... 716/111
See application file for complete search history.

(56) References Cited

U.S. PATENT DOCUMENTS

| 8,832,165 | B2 | 9/2014 | Mien et al. |
| 10,452,989 | B2 | 10/2019 | Majumdar |
| 2017/0329136 | A1 | 11/2017 | Bates et al. |
| 2020/0160205 | A1* | 5/2020 | Leipold ............... G06F 15/7807 |

* cited by examiner

*Primary Examiner* — Eric D Lee
(74) *Attorney, Agent, or Firm* — Intelletek Law Group, PLLC; Gabriel Daniel, Esq.

(57) ABSTRACT

A method of validating support circuits of a qubit array includes generating virtual control waveforms from one or more abstracted support circuits of the qubit array. An abstracted pulse sequence is created from the virtual control waveforms. The abstracted pulse sequence is converted into waveforms. The waveforms are sent to individual qubits of the qubit array. Output data from the qubit array is captured in response to the sent waveforms.

17 Claims, 9 Drawing Sheets

VIRTUAL TO REAL WAVEFORM EMULATOR

BACKGROUND

Technical Field

The present disclosure generally relates quantum computing, and more particularly, to characterization of support circuits for qubits.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state. Various quantum phenomena, such as superposition and entanglement, do not have analogs in the world of classical computing and therefore may involve special structures, support circuits, techniques, and materials.

SUMMARY

According to various embodiments, a method, a computing device, and a non-transitory computer readable storage medium tangibly embodying a computer readable program code are provided for validating support circuits of a qubit array. Virtual control waveforms are generated from one or more abstracted support circuits of the qubit array. An abstracted pulse sequence is created from the virtual control waveforms. The abstracted pulse sequence is converted into waveforms. The waveforms are sent to individual qubits of the qubit array. Output data from the qubit array is captured in response to the sent waveforms.

In one embodiment, the one or more support circuits include at least one of a digital to analog converter (DAC) of a write path, an analog to digital converter (ADC) of a read path, an isolator, a mixer, and/or an oscillator.

In one embodiment, capturing the output data from the qubit array includes using an abstracted read channel of the one or more abstracted support circuits.

In one embodiment, a statistical mismatch simulation is performed for iteratively updating the one or more abstracted support circuits based on the captured output data.

In one embodiment, the conversion of the abstracted pulse sequence into waveforms includes sending the abstracted pulse sequence to an arbitrary wave generator (AWG), and receiving the waveforms from the AWG.

In one embodiment, the received waveforms from the AWG include, for each qubit of the qubit array, one or more waveforms having an independently programmable amplitude, an independently programmable phase, and an independently programmable center frequency.

In one embodiment, the waveforms are sent to the individual qubits of the qubit array in parallel, as a cluster.

In one embodiment, the abstracted pulse sequence includes one or more gaussian waveforms.

In one embodiment, a noise is added during the generation of the virtual control waveforms to facilitate an evaluation of a performance of the abstracted support circuits in a noisy environment.

In one embodiment, a physical version of the one or more support circuits is simulated to be operated in a cryogenic environment of the quantum array.

In one embodiment, upon iteratively updating the one or more abstracted support circuits based on the captured output data, replacing the virtual control waveforms with waveforms from a physical version of the one or more support circuits of the qubit array.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In discussing the present technology, it may be helpful to describe various salient terms. As used herein a qubit represents a quantum bit and a quantum gate is an operation performed on a qubit, such as controlling the super-positioning between two qubits.

As used herein, a write path relates to a qubit control line that carries signals to the qubit. The term read path relates to a qubit control line that carries signals from the qubit to measurement equipment. The term multiplexing includes the meaning of a single control line capable of carrying signals for multiple qubits.

Although the terms first, second, third, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as "lossless," "superconductor," "superconducting," "absolute zero," "cryogenic" which are intended to cover functionality that may not be exactly ideal but is within acceptable margins for a given application. For example, a certain level of loss or tolerance may be acceptable such that the resulting materials and structures may still be referred to by these "idealized" terms.

The present disclosure generally relates to superconducting devices, and more particularly, to efficient characterization of qubit support circuits before physical implementation of these circuits. The electromagnetic energy associated with a qubit can be stored in so-called Josephson junctions and in the capacitive and inductive elements that are used to form the qubit. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise and improve the signal-to-noise ratio. Alternatively, or in addition, a microwave signal (e.g., pulse) can be used to entangle one or more qubits. Much of the process is performed in a cold environment (e.g., in a cryogenic chamber), while the microwave signal of a qubit is ultimately measured at room temperature. The amplitude and/or phase of the returned/output microwave signal carries information about the qubit state, such as whether the qubit has dephased to the ground or excited state. The microwave signal carrying the quantum information about the qubit state is usually weak (e.g., on the order of a few microwave photons). To measure this weak signal with room temperature electronics (i.e., outside the refrigerated environment), low-noise quantum-limited amplifiers (QLAs), such as Josephson amplifiers and travelling-wave parametric amplifiers (TWPAs), may be used as preamplifiers (i.e., first amplification stage) at the output of the quantum system to boost the quantum signal, while adding the minimum amount of noise as dictated by quantum mechanics, in order to improve the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors. Additional support circuits that may be used to interact with qubits may include, without limitation, baseband filters, digital to analog converters (DACs), analog to digital converters (ADCs), isolators, mixers, oscillators, and other components used as part of the read and write path of a qubit array.

A qubit system may include one or more readout resonators coupled to the qubit. A readout resonator may be a transmission line that includes a capacitive connection to ground on one side and is either shorted to the ground on the other side, such as for a quarter wavelength resonator, or may have a capacitive connection to ground, such as for a half wavelength resonator, which results in oscillations within the transmission line, with the resonant frequency of the oscillations being close to the frequency of the qubit. For example, the readout resonator affects a pulse coming from the control/measurement instruments at the readout resonator frequency. The pulse acts as a measurement that decoheres the qubit and makes it collapse into a state of "one" or "zero," thereby imparting a phase shift on that measurement pulse.

Between qubits there may be a coupling resonator, sometimes referred to herein as a coupler resonator or resonator induced phase (RIP) bus, which allows coupling different qubits together in order to realize quantum logic gates. The coupling resonator is typically structurally similar to the readout resonator. However, more complex designs are possible. When a qubit is implemented as a transmon, each side of the coupling resonator is coupled (e.g., capacitively or inductively) to a corresponding qubit by being in adequate proximity to (e.g., the capacitor of) the qubit. Since each side of the coupling resonator has coupling with a respective different qubit, the two qubits are coupled together through the coupling resonator (e.g., RIP bus). In this way, there is mutual interdependence in the state between coupled qubits, thereby allowing a coupling resonator to use the state of one qubit to control the state of another qubit. Entanglement occurs when the interaction between two qubits is such that the states of the two cannot be specified independently, but can only be specified for the whole system. In this way, the states of two qubits are linked together such that a measurement of one of the qubits, causes the state of the other qubit to collapse.

The ability to include more qubits is salient to being able to realize the potential of quantum computers. Generally, performance increases as temperature is lowered, for example by reducing the residual thermally-excited state qubit population and decreasing the thermal broadening of the qubit transition frequencies. Accordingly, the lower the temperature, the better for a quantum processor.

To take advantage of the functionality of qubits, not only must there be adequate support circuitry, which is typically in the cryogenic environment, but the support circuitry must function properly to increase the computational power and reliability of a quantum computer. Testing a qubit array typically involves using a physical qubit array coupled to physical chips in a cryogenic environment to test not only characterize the performance of the qubit array, but the functionality of the support circuitry. However, when changes are contemplated to improve the qubit support circuitry in the read and/or the write path, it typically involves providing a new physical implementation of the support circuitry to determine the performance of the new architecture. Such approach that involves physical support circuitry is not time and cost efficient.

In one aspect, what is provided is a virtualization of the support circuit blocks. By virtue of the teachings herein, the impact of control waveforms on both target and spectator qubits can be verified in multi-qubit systems. The methods are forward scalable and can be technology independent. Noise and signal processing block impairments, such as spurs, amplitude effects, etc., can be identified. Since the characterizations of the operation and control of qubits can be performed before the support circuitry is physically built, valuable insight can be gained into the interaction of qubits with the supporting circuits. The present method can support generating specifications on the performance of the qubits before fabrication.

The teachings herein create abstract versions of circuits to emulate output waveforms thereof. These simulated output waveforms are then applied to real quantum qubits. The feedback received from the qubits in response to the applied signals is also measured, thereby creating a feedback loop, which allows the characterization and development of the support circuitry for quantum chips. Accordingly, data can be read into individual qubits and read out of individual qubits of a qubit array by using virtual support circuitry. In one embodiment, before providing the waveforms to the physical qubits, the waveforms can be manipulated with respect to temperature either before a waveform generator engine or inside a pulse generator using an appropriate scaling factor, if low temperature models are not available. In one embodiment, stimulus can be generated through actual hardware if it is available. Such hardware can quickly test (i.e., determine) whether an amplitude envelope can be further tuned with respect to qubits without having an elaborate qubit hardware set-up.

Since the circuits, aside from the qubit array, are in the virtual realm, they can be readily reconfigured (e.g., from 8-bit digital to analog converter (DAC) to a 10-bit DAC, etc.). Different architectures of circuits can be developed and optimized for different process corners (e.g., nominal, best case, worst case, etc.,) for functionality and performance before proceeding to the next level of actual hardware implementation, thereby saving valuable time and hardware resources.

In one aspect, the teachings herein are based on Applicants' insight that directly applying conventional integrated circuit techniques for interacting with computing elements to superconducting quantum circuits may not be effective because of the unique challenges presented by quantum circuits that are not presented in classical computing architectures. Accordingly, embodiments of the present disclosure are further based on recognition that issues unique to quantum circuits have been taken into consideration when evaluating applicability of conventional integrated circuit techniques to building superconducting quantum circuits, and, in particular, to electing methods and architectures used for interacting efficiently with qubits.

Example Architecture

Figure 1:
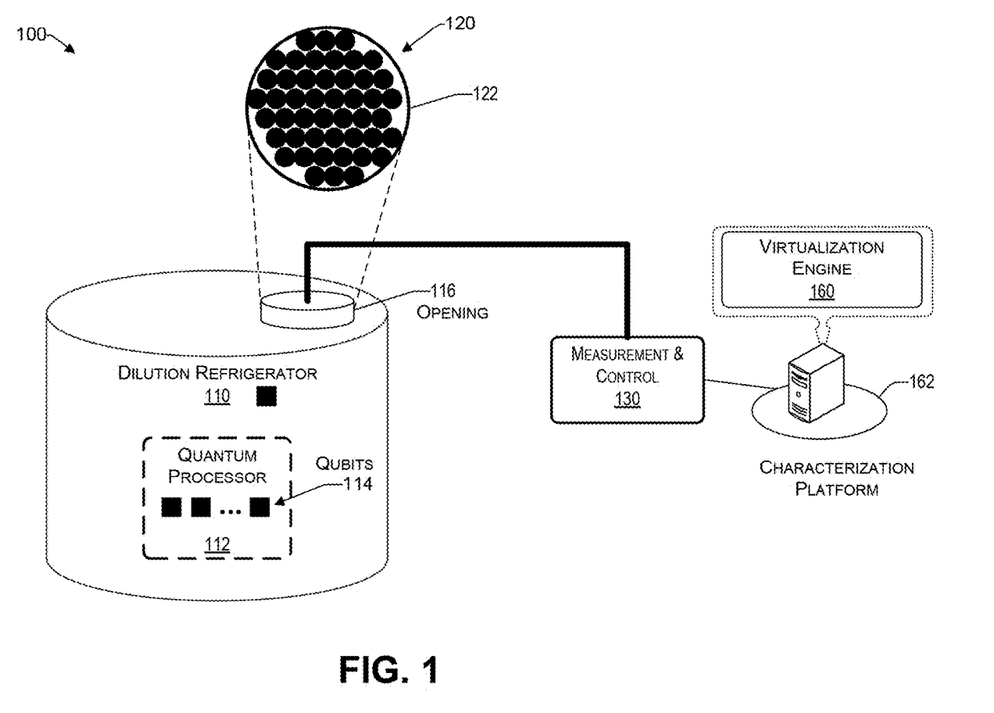
FIG. 1 illustrates an example architecture of a quantum computing system, consistent with an illustrative embodiment.

FIG. 1 illustrates an example architecture 100 of a quantum computing system, consistent with an illustrative embodiment. The architecture 100 includes a quantum processor 112 comprising a plurality of qubits 114. The quantum processor 112 is located in a refrigeration unit 110, which may be a dilution refrigerator. A dilution refrigerator is a cryogenic device that provides continuous cooling to temperatures typically 10 mK. Most of the physical volume of the architecture 100 is due to the large size of the refrigeration unit 110.

There is a measurement and control unit 130 that is outside of the refrigeration unit 110. The measurement and control unit 130 is able to communicate with the quantum processor through an opening 116, sometimes referred to as a bulkhead of the dilution refrigerator 110, that also forms a hermetic seal separating the ambient atmospheric pressure from the vacuum pressure of the cryostat under operation. The measurement and control unit 130 may include test equipment used to generate electrical waveforms. In some embodiments, the measurement and control unit 130 may include an arbitrary waveform generator (AWG), discussed in more detail later.

As mentioned above, the teachings herein facilitate a characterization of the support circuitry in both the read path and the write path of a quantum processor 112 comprising a plurality of qubits 114 by being able to interact with the qubits 114 by way of virtual circuits. To that end, a characterization platform 162, which may be a computing device, a server, or a distributed computing architecture in a cloud, can host a virtualization engine, which is operative to provide virtual versions of the support circuits and corresponding output waveforms thereof that can interact with the qubits 114 of the quantum processor 112 via measurement and control equipment 130.

Example Stages of the Architecture

Figure 2:
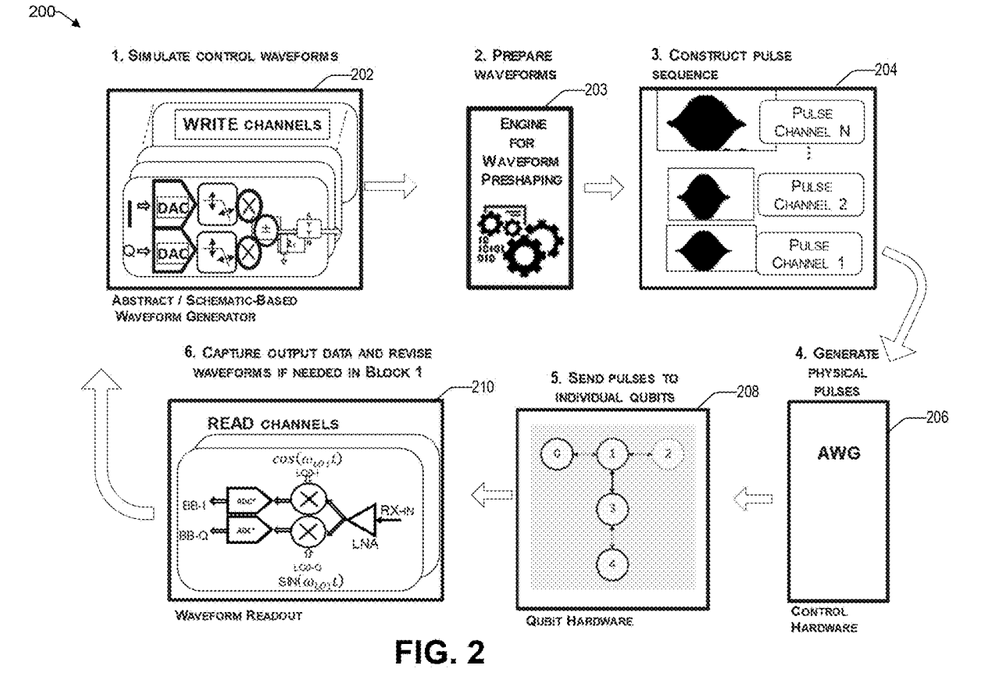
FIG. 2, which illustrates a system for simulation and verification of a physical qubit array, consistent with an illustrative embodiment.

Reference now is made to FIG. 2, which illustrates a system 200 for simulation and verification of a physical qubit array, consistent with an illustrative embodiment. The system 200 is described by way of different stages that may follow an iterative process that facilitates the characterization of the qubits of the qubit array, as well as development of the appropriate circuit architecture in support of the qubit array. In each iteration the circuits and/or signals can be iteratively refined until a desired complete qubit architecture, including the supporting circuitry of the qubit, can be virtually designed. Upon optimizing the support circuits of a qubit array in a virtual environment, these virtual designs can then be implemented in hardware, which is typically then operated in a cryogenic environment in support of reading from and writing to individual qubits of a qubit array.

The first stage 202 provides a virtual representation of contemplated support circuits to be used to interact with the qubit array of the quantum processor 112 of FIG. 1. For example, these circuits may include virtual (e.g., a software version) of DACs, filters, mixers, summation nodes, oscillators, etc. Once the characterization discussed herein is completed, the virtual circuits of the first stage will ultimately be replaced with hardware, which may operate in a cryogenic environment. For example, a circuit (e.g., analog) level description for a "write" path that provides output current can be described in the first stage 202. These circuits are abstracted to a virtual platform such as Verilog, or models are created through statistical functions. In some embodiments, a high resolution, low power phase locked clocking per channel to cover Qubit center frequency shifts can also be abstracted.

Waveforms can be assembled at different stages of a design process (e.g., take I and Q quadratures from pre or post mixing, or modify a number of bits of precision in the DAC) to provide flexibility in the virtual circuit design process. In some embodiments, noise, distortion, as well statistical techniques Mixture Important sampling, Monte Carlo, Machine learning techniques such as Support Vector Machine etc., can be added to these abstract models of the support circuits, to represent different circuit architectures, as well as simulation corners (e.g., best case, worst case, nominal case, etc.).

The output of the abstracted (i.e., virtual) write path is provided to a third stage 204 that is configured to create a pulse sequence from the control waveforms of the first stage via a second stage 203 that is operative to prepare the waveforms received from the first stage. Depending on the nature of the abstract waveforms and the desired qubit operations to be performed, at this stage 203 it may involve the envelope of the abstracted pulse shapes to be mathematically extracted, the starting and ending points of the waveforms to explicitly defined, and/or the point spacing (or sampling rate) of the waveforms set to be commensurate with the physical hardware that is used to produce the pulse shapes. Moreover, in some embodiments, at stage 203 the pulse shapes can be modified by intentionally introducing noise, e.g. Gaussian white noise, thermal noise, etc., to the waveforms from the abstract models of the support circuits. In some embodiments noise spurs at specified frequencies can be superimposed on the waveforms of the abstract models of the support circuits. In some embodiments, predistortion factors can be added to the abstract models, for instance, to offset nonideal distortions to the waveforms as they travel down the control wires in the cryostat and through elements in the control path, such as attenuators and microwave filters, prior to arriving at the qubits.

In addition, at the third stage 204, multiple instances of the various pulse shapes and types of may be assembled into a sequence of desired operations that are separated by specified time delays required by the qubits. Each channel leading to a dedicated qubit may receive its independent pulse or combination of pulses. With the pulses provided by the third stage 204, the virtualization engine can probe deep into the quantum device to qubit level, as if a physical supporting circuitry were present in a cryogenic environment of the qubit device. In this regard, it is noted that quantum computers are controlled with precise pulses that stimulate the qubits and manipulate their state. Developing and calibrating these pulses can also be facilitated by the virtualization engine. A software development kit for simulating quantum systems, such as QuTiP, Qiskit, or OpenPulse, which may be open source software, can be used to perform simulated models or experimental tests on the qubits of the qubit array rapidly. As used herein, the term "simulated models" relates to, rather than generating physical waveforms that are sent to the physical qubits, one providing abstract waveforms into simulated Hamiltonian-based models of the qubits (e.g., facilitated by QuTIP or Qiskit). In some embodiments, the signals can be parallelized to write to multiple qubits concurrently, thereby improving the efficiency of the present system 200.

For example, comma-separated values (CSV) files of output (e.g., Verilog) simulated waveform shapes provided by the first stage 202 are loaded into a quantum system software development kit, such as Qiskit, and then remotely generated experimentally on commercial off-the-shelf (COTS) arbitrary waveform generators (AWGs) in the fourth stage 206, discussed in more detail below. Verilog simulated waveforms can be quickly tested even for multi-step operations or sequences. For example, the efficacy of typical qubit calibration routines for frequency, amplitude, Derivative Removal via Adiabatic Gate (DRAG), randomized benchmarking etc., can be evaluated using the simulated waveforms of the first stage 202. It is noted that DRAG is a calibration routine in quantum computing that includes applying a Gaussian and derivative-of-Gaussian pulses to the respective I and Q quadratures, which allows to tune the pulses to reduce qubit leakage into unwanted energy levels. The teachings herein facilitate a direct control of the support circuits in both the write and read path of a qubit array, including the implementation of gates and measurements, which are the building blocks of the quantum circuits, in a virtual environment.

The pulses of the third stage are provided to a fourth stage 206, representing control hardware that is operative to generate physical pulses from the virtual pulses provided. To that end, in one embodiment, an arbitrary waveform generator (AWG). It will be understood that the AWG should have an adequate precision in order to mimic the exact pulse shape and spectral content of the waveforms provided by the third stage 204.

In the fifth stage 208, the generated pulses are sent to individual qubits by the control hardware of the fourth stage 206. For example, once the pulse sequence is communicated from the third stage 204 to the COTS AWG in the fourth stage 206, the pulse sequence is initially stored in the local memory of the AWG (i.e., third stage 206). Then, when the experiment is ready to be executed, the entire pulse sequence is produced by the AWG and sent to the qubits in the refrigerator. In practice, this process can occur very quickly in under a few seconds.

In the sixth stage, a receiving hardware captures the output signals from the qubits and provides it to a computing device that processes these signals by way of a virtual representation of the contemplated support circuits that are to be used for the receiving architecture of the qubit, similar to the approach in the first stage 202. The iterative process can continue until the appropriate architecture of the support circuit for the write and read paths are optimized and ready for hardware implementation.

For example, to extract data from the qubit array, represented by block 208, a measurement is performed with pulses that are under control of the virtualization engine described herein. After the qubit stimulus pulse generated in the virtual domain by the third stage 204 and converted into a physical pulse in the fourth stage 206, a measurement stimulus is provided on the measure channel, which is a pulse of a different shape. This pulse measures the qubit, then travels out of the fridge, carrying information about the state of the qubit via its shape. To detect this output signal from the qubit array, an acquisition of this measurement is scheduled. For example, qubits use different stimuli applied for control and for readout. The sequence of control pulses (e.g., Gaussian pulses, cross resonance gates, etc.,) are initially applied at or around the resonant frequency of the various qubits. Those control pulses are then followed by a single measurement or readout pulse that is set to a different frequency (typically a few GHz higher than the qubit frequencies) commensurate with the readout resonators directly connected to the qubits. The readout pulses are also produced by the AWG in 206 and are included in the pulse sequence, but are designated to a different readout or measurement "channel" on the AWG. In principle the readout pulses could also be designed via abstract waveforms in Verilog and sent to the AWG similar to the control pulses. Example pulses are discussed below.

Example Qubit Pulses and Control Waveforms

Figure 3:
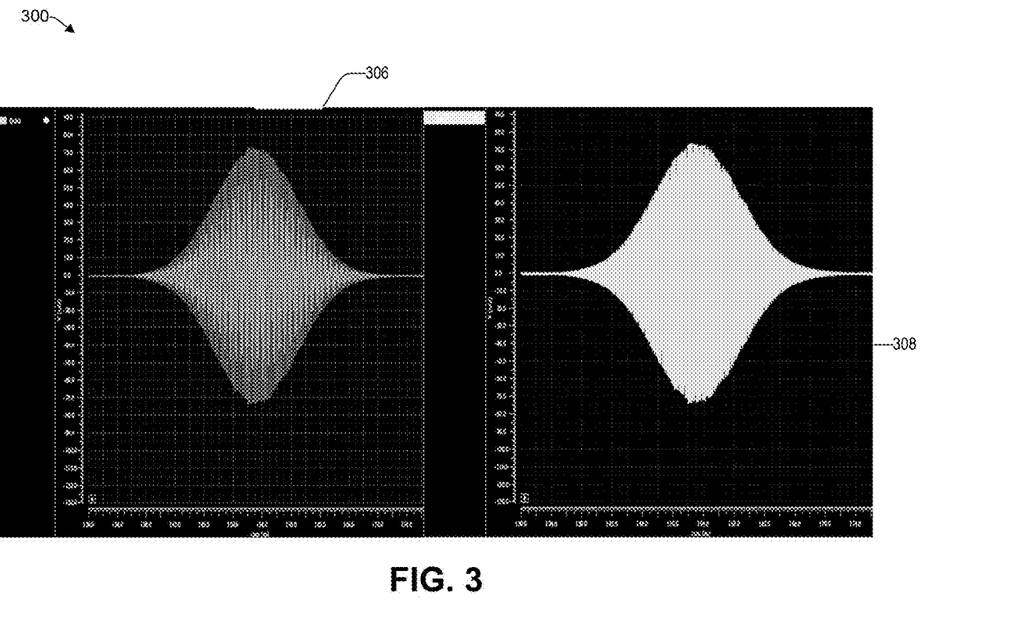
FIG. 3, which provides example waveforms of a gaussian shaped pulse as an output of the third stage of FIG. 2, which can be used as an input signal for a qubit, consistent with an illustrative embodiment.

Reference now is made to FIG. 3, which provides example waveforms 306, 308 of a gaussian shaped pulse as an output of the third stage of FIG. 2, which can be used as an input signal for a qubit, consistent with an illustrative embodiment. For example, each gaussian waveform 306 is configured by the third stage 204 to have a frequency that is adequate to change a state of a corresponding qubit in the qubit array, consistent with an illustrative embodiment. In the example of FIG. 3, the waveforms 300 have a center frequency of 4.97445 GHz. This is an example output of the third stage 204.

Figure 4:
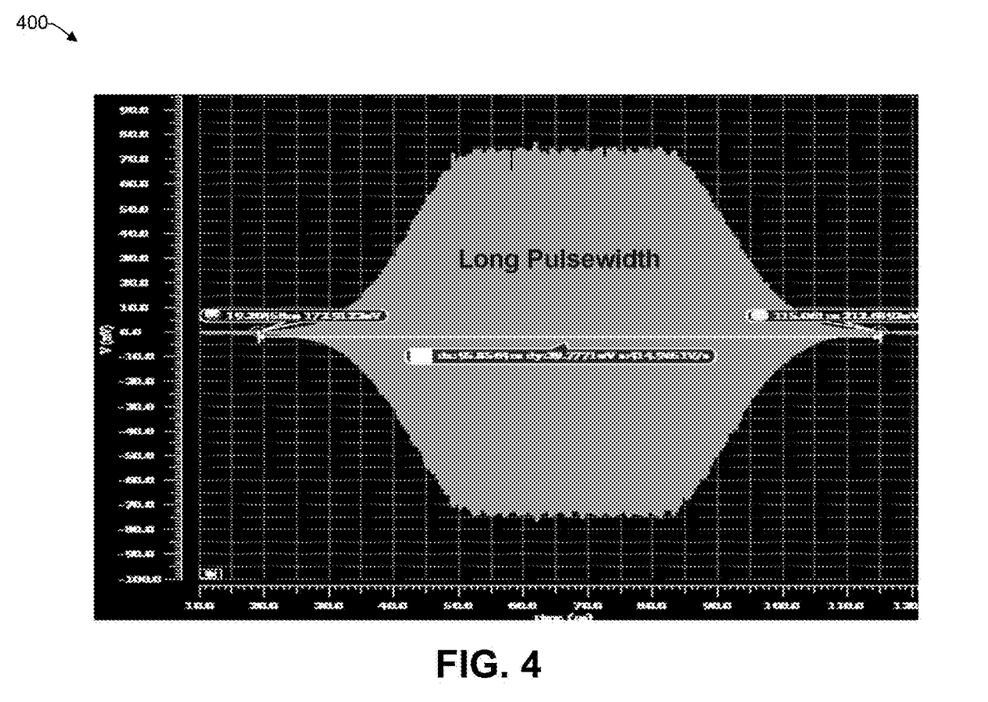
FIG. 4 illustrates an example Gaussian-square shaped pulse of the third stage of FIG. 2, consistent with an illustrative embodiment.

While a Gaussian waveform is shown by way of example in FIG. 3, it will be understood that different types of waveforms can be generated by the third stage 204. In this regard, FIG. 4 illustrates an example Gaussian-square shaped pulse 400 of the third stage of FIG. 2, consistent with an illustrative embodiment. For example, this shaped pulse 400 can be generated for testing a 2-Qubit cross resonance (CR) gate. In the example of FIG. 4, the pulse width is approximately 85 ns and has a frequency of 4.8195 GHz.

Figure 5A:
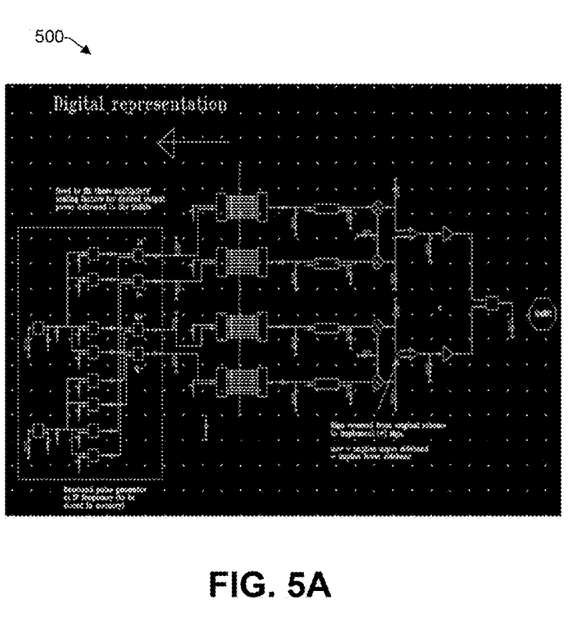
FIG. 5A illustrates an example waveform abstraction for an 8 Bit digital to analog converter (DAC) part of a write path of the first stage of FIG. 2, consistent with an illustrative embodiment.
Figure 5B:
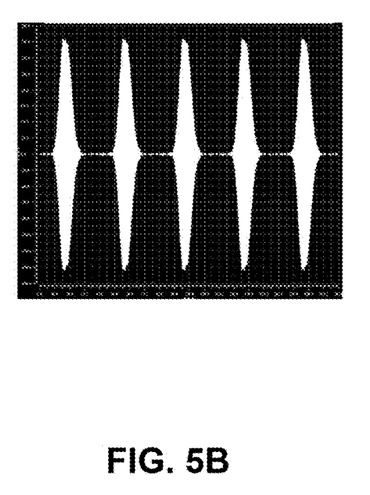
FIG. 5B represents a resulting pulse sequence to drive an 8 bit DAC of FIG. 5A, consistent with an illustrative embodiment.

Reference now is made to FIG. 5A, which illustrates an example waveform abstraction for an 8 Bit digital to analog converter (DAC) part of a write path of the first stage of FIG. 2, consistent with an illustrative embodiment. For example, FIG. 5A may represent a circuit block that may be provided by the first stage 202 of FIG. 2. FIG. 5B represents the resulting pulse sequence to drive an 8 bit DAC of FIG. 5A.

Figure 6A:
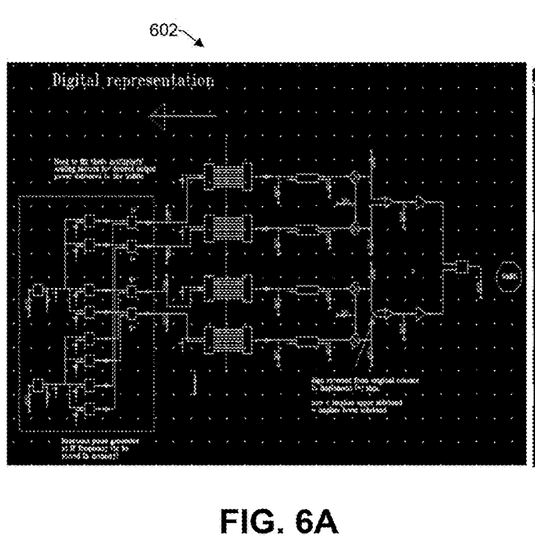
FIGS. 6A and 6B illustrate an example 10 bit DAC and the governing waveforms thereof, respectively, consistent with illustrative embodiments.
Figure 6B:
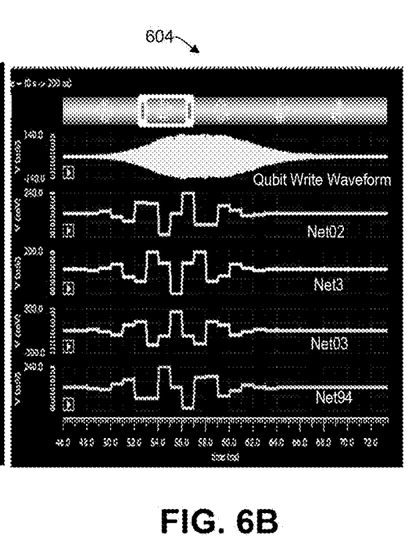

Similarly, FIGS. 6A and 6B illustrate an example 10 bit DAC and the governing waveforms thereof, respectively, consistent with illustrative embodiments. More specifically, waveforms 604 provide information about the operation at different nodes of the circuit 602 of FIG. 6A. While 8 and 10 bit DACS are discussed herein, it will be understood that they are provided by way of example only and not by way of limitation. Other types of DACS and ADC, as well as other circuit structures that are used in a write or read path, are contemplated by the teachings herein as well.

Example Process

Figure 7:
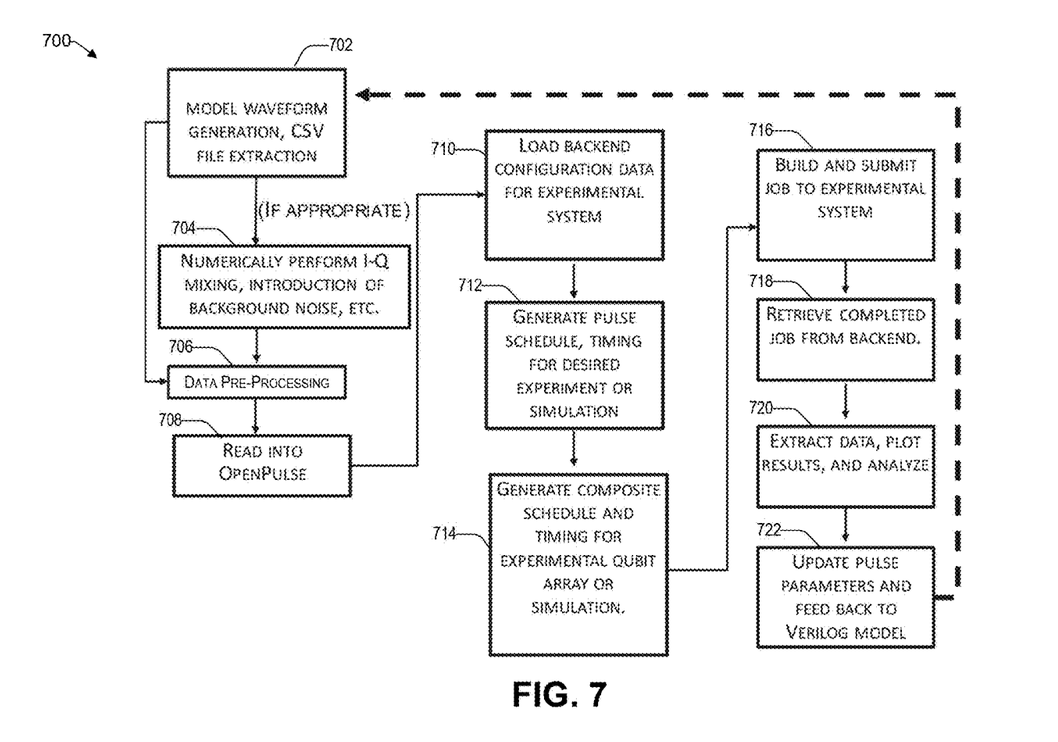
FIG. 7 presents a process related to writing signals to and reading signals out from a quantum processor to characterize support circuitry and/or one or more qubits of a qubit array, consistent with an illustrative embodiment.
Figure 8:
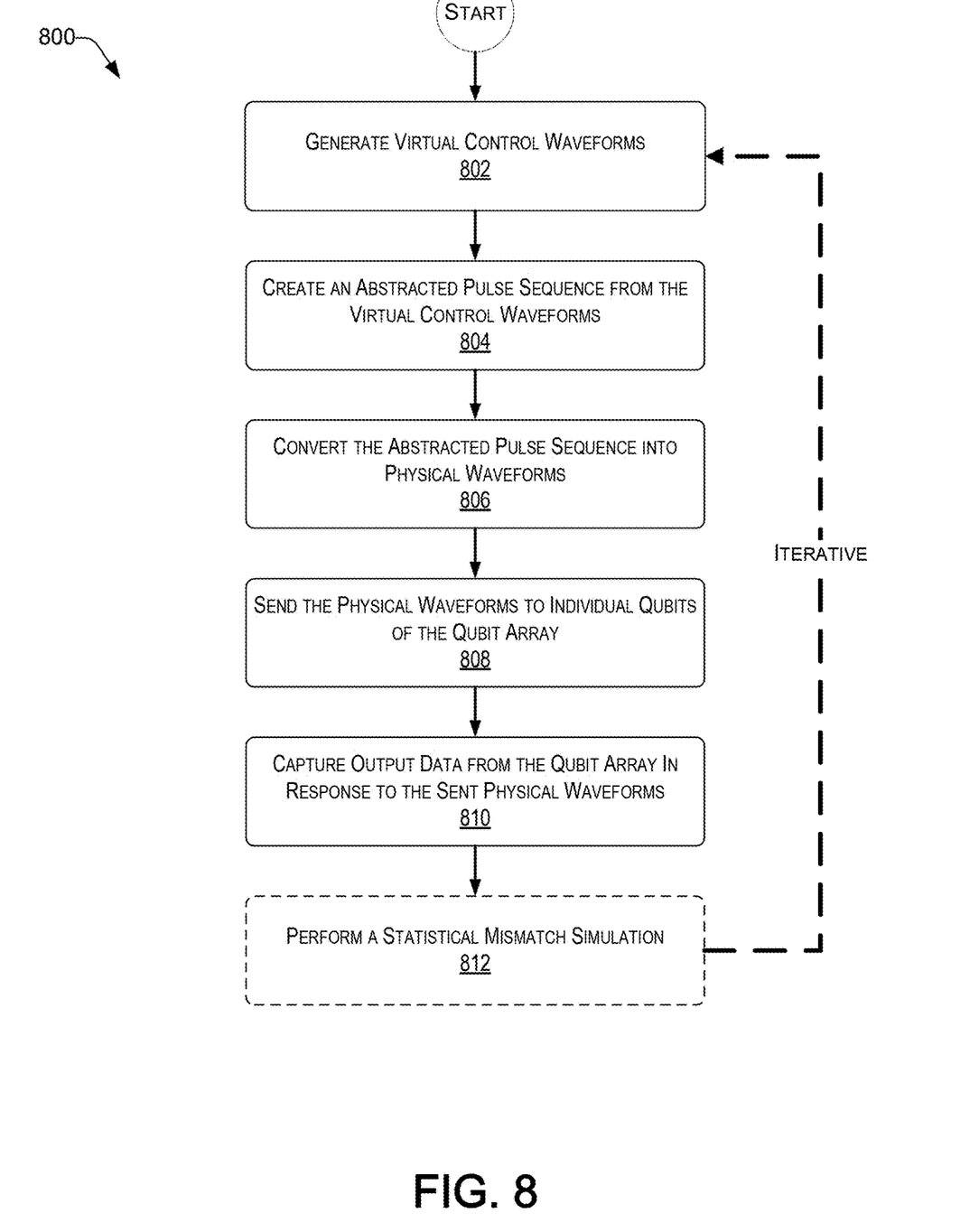
FIG. 8 is an example process for validating support circuits for a qubit array, consistent with an illustrative embodiment.

With the foregoing overview of the example architecture and systems for simulation and verification of a physical qubit array, it may be helpful now to consider a high-level discussion of an example process. To that end, FIGS. 7 and 8 present illustrative processes related to writing signals to and reading signals out from a quantum processor to characterize support circuitry and/or one or more qubits of a qubit array. Processes 700 and 800 are illustrated as a collection of blocks, in a logical flowchart, which represents a sequence of operations that can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform functions or implement abstract data types. In each process, the order in which the operations are described is not intended to be construed as a limitation, and any number of the described blocks can be combined in any order and/or performed in parallel to implement the process. For discussion purposes, the process is described with reference to the architecture of FIGS. 1 and 2.

At block 702, during a first stage, model waveforms are generated by way of a virtual representation of contemplated support circuits to be used to interact with the qubit array of the quantum processor 112 of FIG. 1. For example, these circuits may include virtual (e.g., a software version) of DACs, filters, mixers, summation nodes, oscillators, etc.

At block 704, if appropriate, I-Q mixing is numerically performed, background noise may be introduced, etc., during the first stage 202 For example, to have control of the qubits, the virtualization engine 160 needs to be able to change the waveforms assigned to both the in-phase (I) and in-quadrature (Q) parts of the waveform (i.e., basically the real and imaginary parts of the waveform—it is a complex entity). The noise in principle can be added independently to either the I, Q, or both channels of the waveform. When the I and Q portions are numerically reassembled into a single complex waveform, they referred to herein as having been "mixed."

At block 706, data formatting and preprocessing is performed. By that we mean defining the starting and ending points of the individual waveforms within the pulse sequence, setting the point spacing (or sampling rate) of the waveforms so that they are commensurate with the physical AWG hardware, or extracting the pulse envelope.

At block 708, the output of the abstracted (i.e., virtual) write path is provided to a third stage 204, which is configured to create a pulse sequence from the control waveforms of the first stage. By way of example only and not by way of limitation OpenPulse can be used to construct a pulse sequence based on the received control waveforms of the first stage 202.

At block 710, a backend configuration data is loaded for the experimental system during the third stage 204. In this regard, the device parameters of the particular quantum system is retrieved and the physical hardware associated with it. For example, the virtualization engine needs to determine parameters, such as the qubit and readout frequencies, which qubits are available for use, how they are connected on the chip, the sampling rate of the AWGs that will be used to make the pulses, etc. This configuration data is salient to know prior to constructing the pulse sequences.

At block 712, during the third stage 204, a pulse schedule and timing is generated for an experiment or simulation. For example, each channel leading to a dedicated qubit may receive its independent pulse or combination of pulses. There are "schedules" of pulse sequences for both the control and readout channels that involve accurate "timing" between the individual pulses within each channel, as well as between the respective channels themselves.

At block 714, during the fourth stage 206, a composite schedule and timing for an experimental qubit array or simulation is generated. For example, once the virtualization engine has defined the schedules for each of the control and readout channels for each of the individual qubits, they are assembled into a "composite schedule." These can be interpreted as "a schedule of schedules," that is, the net total schedule for the entire experiment to be performed on all the qubits, which also specifies the relative timing between the schedules for each qubit.

At block 716, during a fifth stage 208, a job is built and submitted to the experimental system (i.e., the one or more qubits of a qubit array). It is noted that a definition of "job" and "built" could be different depending on which quantum software stack is being used. In Qiskit, for example, a "job" is a final set of operations that the user submits to the quantum hardware. This may encompass the full "composite schedule" of the experiment and the individual library of pulse shapes defined within. In one embodiment, the virtualization engine 160 uses an open-source module within Qiskit called "Pulse" or "OpenPulse," which takes this information and converts it into a schedule that is formatted to be compatible with whatever AWG hardware is being used on that particular backend.

At block 718, during a sixth stage, a receiving hardware, which may be the measurement and control unit 130, captures the output signals from the physical qubits, sometimes referred to herein as the backend, and provides it to a computing device.

At block 720, the data from the receiving hardware (e.g., 130) is extracted, results plotted, and analyzed for relevant parameters, such as center frequency, bandwidth, rise time, fall time delay, etc.

At block 722, the pulse parameters are updated and fed back to block 702 to generate new model waveforms (i.e., virtual representation of the support circuit, which may be in Verilog). Accordingly, the iterative process continues until the desired parameters for each supporting circuit block are identified. The support circuits can then be physically fabricated to replace the virtual circuits of block 702.

Reference now is made to FIG. 8, which is an example process for validating support circuits for a qubit array. For example, the support circuits may include various circuits that may be part of a write or read path of a qubit array that is typically operated in a cryogenic environment of the qubit array.

At block 802, virtual control waveforms from one or more abstracted support circuits of the qubit array are generated.

At block 804, an abstracted pulse sequence is created from the virtual control waveforms. For example, the pulse sequence from the virtual control waveforms be created using at least one of QuTiP, Qiskit, or OpenPulse, as discussed previously.

At block 806, the abstracted pulse sequence is converted into "physical" (e.g., real world) waveforms. For example, the abstracted pulse sequence may be sent to an arbitrary wave generator (AWG) and physical waveforms are received therefrom. In one example, the AWG is configured to generate, for each qubit of the qubit array, one or more waveforms having an independently programmable amplitude, an independently programmable phase, and an independently programmable center frequency. In some embodiments, the AWG is part of a virtualization engine.

At block 808, the physical waveforms are sent to individual qubits of the qubit array. In one embodiment, the physical waveforms are sent to the individual qubits of the qubit array in parallel, as a cluster.

At block 810, output data from the qubit array is captured in response to the sent physical waveforms. For example, an abstracted read channel of the abstracted support circuits can be used by the virtualization engine.

In some embodiments, at block 812 statistical mismatch simulation is performed for iteratively updating the one or more abstracted support circuits based on the captured output data. Upon determining that a threshold performance and/or accuracy is achieved by the virtual support circuits, then the process ends and a physical version of the support circuits can then be generated.

Example Computer Platform

Figure 9:
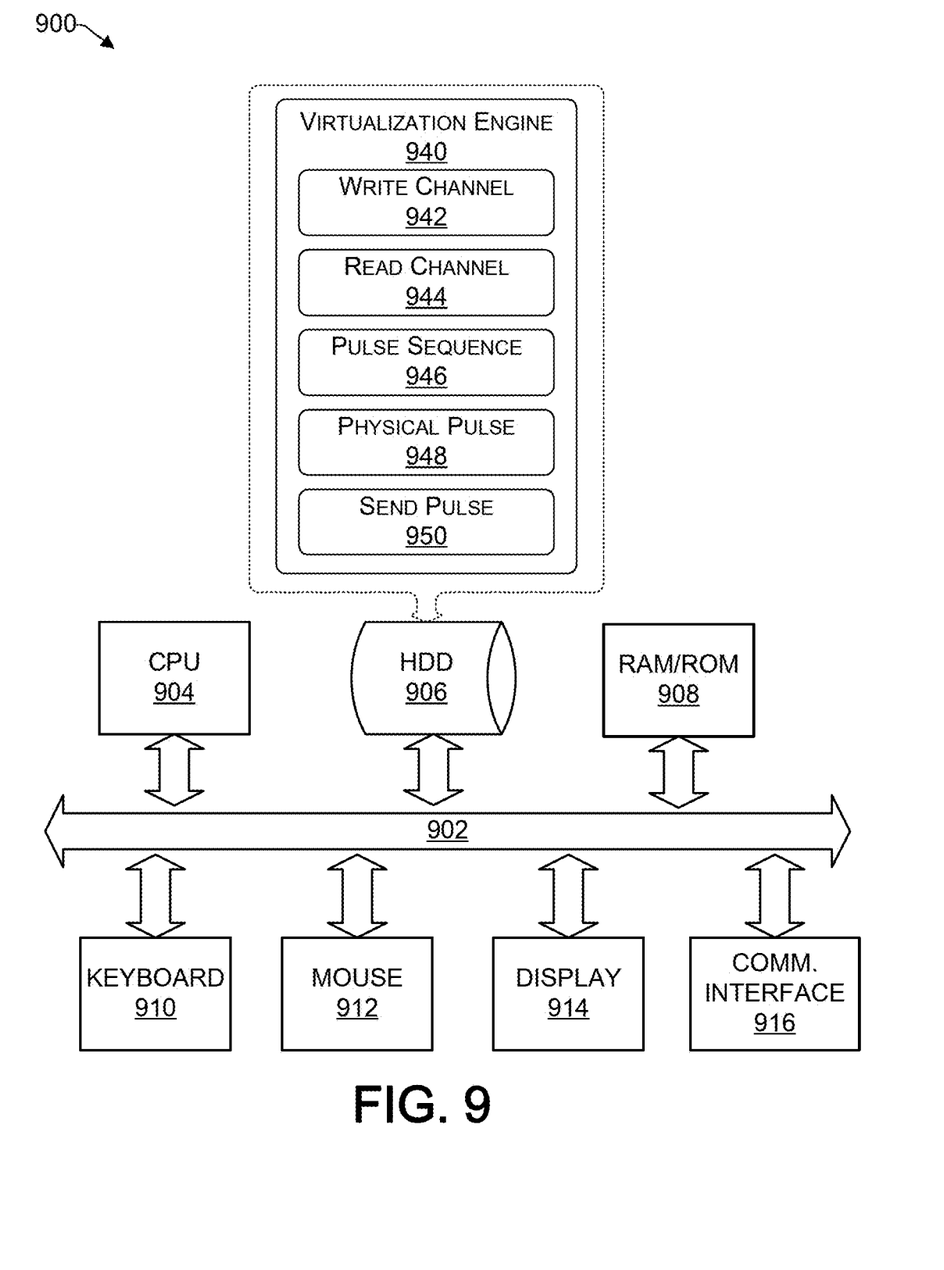
FIG. 9 provides a functional block diagram illustration of a computer hardware platform 900 that can be used to implement a particularly configured computing device that can host a qubit virtualization engine.

As discussed above, functions relating to interacting with qubits by way of validating support circuits of a qubit array by way of virtualized circuits and waveforms thereof, as discussed in the context of FIGS. 1 and 2, may include an appropriate configured computing device. FIG. 9 provides a functional block diagram illustration of a computer hardware platform 900 that can be used to implement a particularly configured computing device that can host a qubit virtualization engine 940. In particular, FIG. 9 illustrates a network or host computer platform 900, as may be used to implement an appropriately configured computing device, such as the characterization platform 162 of FIG. 1.

The computer platform 900 may include a central processing unit (CPU) 904, a hard disk drive (HDD) 906, random access memory (RAM) and/or read only memory (ROM) 908, a keyboard 910, a mouse 912, a display 914, and a communication interface 916, which are connected to a system bus 902.

In one embodiment, the HDD 906, has capabilities that include storing a program that can execute various processes, such as the virtualization engine 940, in a manner described herein. The virtualization engine 940 may have various modules configured to perform different functions. For example, there may be a write channel module 942 and a read channel module 944 that are operative to provide a virtual representation of contemplated support circuits of a write channel, respectively, to be used to interact with the qubit array of a quantum processor. There may be a pulse sequence module 946, sometimes referred to herein as the third stage, configured to create a pulse sequence from the control waveforms provided from the write channel, sometimes referred to herein as the first stage. There may be a physical pulse module 948, sometimes referred to herein as the fourth stage, which represents a module operative to interact with an arbitrary waveform generator to generate physical pulses from the virtual pulses provided. In one embodiment, there is a send pulse module 950 operative to initiate a sending of pulses to individual qubits of the physical qubit array.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

Aspects of the present disclosure are described herein with reference to a flowchart illustration and/or block diagram of a method, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of an appropriately configured computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The call-flow, flowchart, and block diagrams in the figures herein illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A method of validating support circuits of a qubit array, comprising:
    generating virtual control waveforms from one or more abstracted support circuits of the qubit array;
    creating an abstracted pulse sequence from the virtual control waveforms;
    converting the abstracted pulse sequence into new waveforms comprising: sending the abstracted pulse sequence to an arbitrary wave generator (AWG); and receiving the new waveforms from the AWG;
    sending the new waveforms to individual qubits of the qubit array; and
    capturing output data from the qubit array in response to the sent new waveforms.

2. The method of claim 1, wherein the one or more abstracted support circuits comprise at least one of:
a digital to analog converter (DAC) of a write path;
an analog to digital converter (ADC) of a read path;
an isolator;
a mixer; and
an oscillator.

3. The method of claim 1, wherein capturing the output data from the qubit array comprises using an abstracted read channel of the one or more abstracted support circuits.

4. The method of claim 1, further comprising performing a statistical mismatch simulation for iteratively updating the one or more abstracted support circuits based on the captured output data.

5. The method of claim 4, further comprising upon iteratively updating the one or more abstracted support circuits based on the captured output data, replacing the virtual control waveforms with waveforms from a physical version of the one or more support circuits of the qubit array.

6. The method of claim 1, wherein the received waveforms from the AWG comprise, for each qubit of the qubit array, one or more waveforms having an independently programmable amplitude, an independently programmable phase, and an independently programmable center frequency.

7. The method of claim 1, wherein the waveforms are sent to the individual qubits of the qubit array in parallel, as a cluster.

8. The method of claim 1, further comprising adding a noise during the generation of the virtual control waveforms to facilitate an evaluation of a performance of the abstracted support circuits in a noisy environment.

9. The method of claim 1, wherein a physical version of the one or more abstracted support circuits is simulated to be operated in a cryogenic environment of the qubit array.

10. A method of validating support circuits of a qubit array, comprising:
generating virtual control waveforms from one or more abstracted support circuits of the qubit array;
creating an abstracted pulse sequence from the virtual control waveforms;
converting the abstracted pulse sequence into new waveforms;
sending the new waveforms to individual qubits of the qubit array; and
capturing output data from the qubit array in response to the sent new waveforms, wherein the abstracted pulse sequence comprises one or more Gaussian waveforms.

11. A computing device comprising:
a processor;
an engine coupled to the processor, wherein an execution of the engine by the processor configures the computing device to perform acts comprising:
generating virtual control waveforms from one or more abstracted support circuits of a qubit array;
creating an abstracted pulse sequence from the virtual control waveforms;
converting the abstracted pulse sequence into new waveforms;
sending the new waveforms to individual qubits of the qubit array;
capturing output data from the qubit array in response to the sent new waveforms; and
performing a statistical mismatch simulation for iteratively updating the one or more abstracted support circuits based on the captured output data.

12. The computing device of claim 11, wherein capturing the output data from the qubit array comprises using an abstracted read channel of the one or more abstracted support circuits.

13. The computing device of claim 11, wherein the waveforms are sent to the individual qubits of the qubit array in parallel, as a cluster.

14. A non-transitory computer readable storage medium tangibly embodying a computer readable program code having computer readable instructions that, when executed, causes a computing device to carry out a method of validating support circuits of a qubit array, comprising:
generating virtual control waveforms from one or more abstracted support circuits of the qubit array;
creating an abstracted pulse sequence from the virtual control waveforms;
converting the abstracted pulse sequence into new waveforms;
sending the new waveforms to individual qubits of the qubit array;
capturing output data from the qubit array in response to the sent new waveforms; and
performing a statistical mismatch simulation for iteratively updating the one or more abstracted support circuits based on the captured output data.

15. The non-transitory computer readable storage medium of claim 14, wherein the conversion of the abstracted pulse sequence into waveforms comprises:
sending the abstracted pulse sequence to an arbitrary wave generator (AWG); and
receiving the waveforms from the AWG.

16. The method of claim 15, wherein the received waveforms from the AWG comprise, for each qubit of the qubit array, one or more waveforms having an independently programmable amplitude, an independently programmable phase, and an independently programmable center frequency.

17. The non-transitory computer readable storage medium of claim 14, wherein the waveforms are sent to the individual qubits of the qubit array in parallel, as a cluster.

* * * * *